US006159294A

United States Patent [19]
Kuster et al.

[11] Patent Number: 6,159,294
[45] Date of Patent: Dec. 12, 2000

[54] APPARATUS FOR COATING BOARD-SHAPED ARTICLES, ESPECIALLY PRINTED CIRCUIT BOARDS

[75] Inventors: Kaspar Kuster, Basel; Anton Rüegge, Allschwil, both of Switzerland

[73] Assignee: Vantico, Inc., Brewster, N.Y.

[21] Appl. No.: 08/115,530

[22] Filed: Sep. 2, 1993

[30] Foreign Application Priority Data

Sep. 9, 1972 [DE] Germany .......................... 928 10 690

[51] Int. Cl.⁷ .................................................. B05C 5/02
[52] U.S. Cl. .............................. 118/642; 34/79; 118/61; 118/324; 118/DIG. 4
[58] Field of Search ..................................... 118/641, 642, 118/61, 300, 324, DIG. 4; 34/7, 189, 190, 224, 225, 79, 72, 513, 514, 77, 86

[56] References Cited

U.S. PATENT DOCUMENTS

| | | | |
|---|---|---|---|
| 3,638,605 | 2/1972 | Grandgirard | 118/50.1 |
| 4,150,494 | 4/1979 | Rothchild | 34/28 |
| 4,324,052 | 4/1982 | Bosher | 34/27 |
| 4,385,450 | 5/1983 | Thomas et al. | 34/21 |
| 4,559,896 | 12/1985 | Bossard et al. | 118/300 |
| 4,926,789 | 5/1990 | Wenger et al. | 118/668 |
| 4,951,401 | 8/1990 | Suzuki et al. | 34/77 |
| 5,113,701 | 5/1992 | Martin | 118/58 |
| 5,113,785 | 5/1992 | Martin | 118/58 |

FOREIGN PATENT DOCUMENTS

| | | |
|---|---|---|
| 0145648 | 9/1984 | European Pat. Off. . |
| 0421931 | 4/1991 | European Pat. Off. . |
| 0441743 | 8/1991 | European Pat. Off. . |
| 0541879 | 11/1991 | European Pat. Off. . |
| 0542684 | 5/1993 | European Pat. Off. . |
| 3239868 | 5/1984 | Germany . |

OTHER PUBLICATIONS

Brochure No. 102–2(0285) of LTG Lufttechnische GmbH.
Derwent Abst. Acc No: 93–183795/23.
Derwent Abst. 93–161129/20.

*Primary Examiner*—Jill Warden
*Attorney, Agent, or Firm*—David R. Chichton

[57] ABSTRACT

An apparatus for coating board-shaped articles, especially printed circuit boards, is described which comprises at least one coating station having a pouring table for coating one surface of the printed circuit boards with preferably UV-hardenable plastics, lacquer or the like, and, adjoining that station, a vapor-removal and drying station having a vapor-removal drier for the removal of vapor from and drying of the coated surfaces of the printed circuit boards in the stream of hot air. The vapor-removal and drying station has an air processing module which is arranged in a housing which adjoins the entrance side of the housing of the vapor-removal drier and extends over the free space above the pouring table.

14 Claims, 4 Drawing Sheets

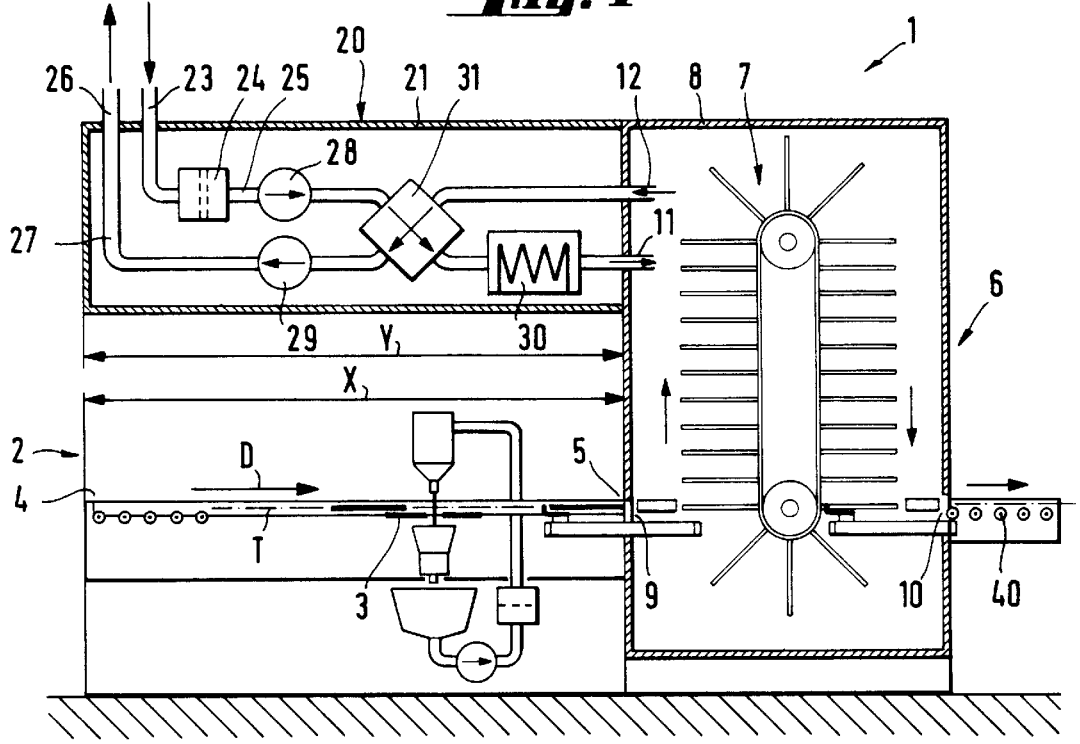
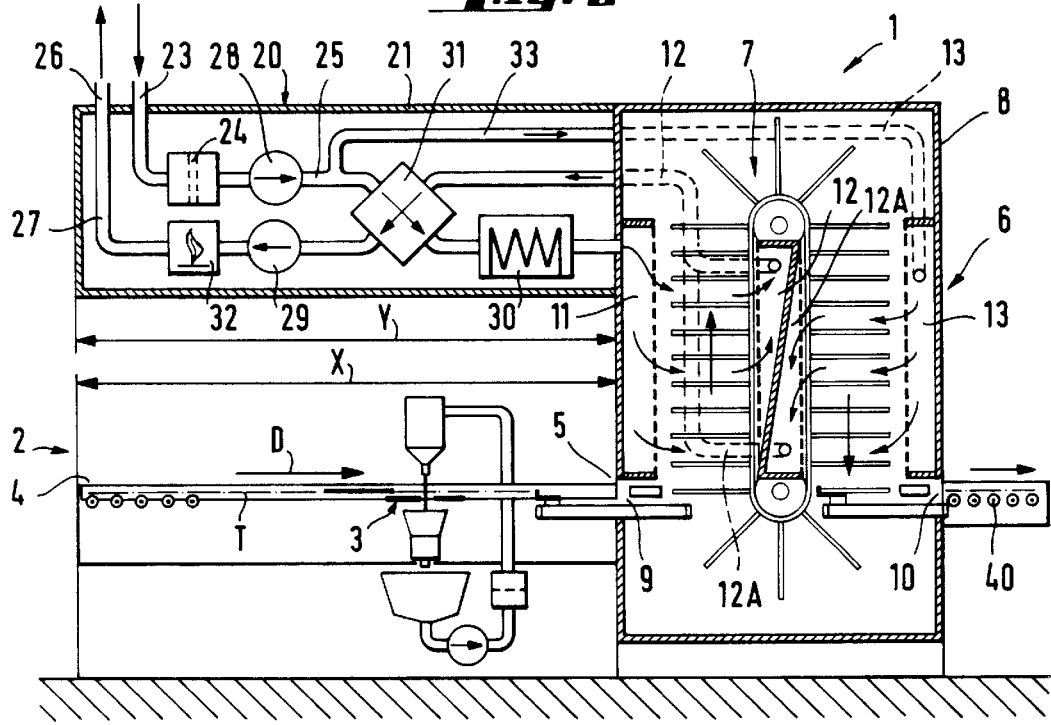

APPARATUS FOR COATING BOARD-SHAPED ARTICLES, ESPECIALLY PRINTED CIRCUIT BOARDS

BACKGROUND OF THE INVENTION

The invention relates to an apparatus for coating board-shaped articles, especially printed circuit boards.

After they have been provided with conductors, printed circuit boards are coated with a protective layer. The protective layer is a preferably UV-hardenable photographically exposable plastics material, lacquer or the like. After drying of the protective layer, it is exposed in a suitable form and developed at the exposed sites. The conductors are then free at those sites and can be electrically contacted. In the case of printed circuit boards that are provided with conductors on both sides, the second surface of the boards is also coated and treated analogously to the first surface. The printed circuit boards are coated in a coating installation which comprises a series of processing stations through which the printed circuit boards to be coated pass in succession.

The previously cleaned printed circuit boards are transported to the entrance of a coating station in which one side of the printed circuit boards is provided with a protective layer. The coating station comprises a pouring table with a free-falling pouring curtain under which the printed circuit boards are transported with the surface to be coated uppermost. If desired or necessary, a preheating station is arranged upstream of the coating station. There the previously cleaned printed circuit boards are preheated in a stream of hot air before being coated. From the preheating station, which is generally constructed as a circulating oven, the printed circuit boards are transferred to the coating station. When the first side has been coated, the printed circuit boards are transported to a vapour-removal and drying station following on from the coating station. In the vapour-removal and drying station, hot air is passed over the coated surface of the printed circuit boards. In that manner, solvent contained in the coating is evaporated (removed by a current of air) and suctioned off, and the coated surface is at least partially dried. In the case of the known coating installations, the printed circuit boards are also turned in the vapour-removal and drying station so that the coated surface of the printed circuit board is facing downwards when it reaches the exit of the station. If the second side of the printed circuit boards is also to be coated, the printed circuit boards are again transported under a pouring curtain of a coating station and finally subjected to vapour-removal and drying in a vapour-removal and drying station.

A coating installation construct ed for coating printed circuit boards on both sides is described, for example, in U.S. Pat. No. 4,926,789. In this known coating installation, a second coating station and a second vapour-removal and drying station follow on from the first coating station and the first vapour-removal and drying station. The printed circuit boards turned in the first vapour-removal and drying station are transported with the as yet uncoated surface uppermost under the free-falling pouring curtain of the second coating station. Then, in the second vapour-removal and drying station, they are transported through one or two circulating vapour-removal driers arranged one behind the other. Hot air is again conveyed over the coated surfaces in order to evaporate (remove by a current of air) solvent contained in the coating, the solvent is removed by suction and the printed circuit boards are dried.

U.S. Pat. No. 5,113,785 and U.S. Pat. No. 5,113,701 describe coating installations that permit printed circuit boards to be coated on one or both sides, as desired. The described coating install stations comprise only a single coating station and a single vapour-removal and drying station. If the printed circuit boards are to be coated on both sides, then, after being turned, they are again transported under the pouring curtain of the first coating station and then subjected to vapour-removal and drying in the single vapour-removal and drying station. In the case of the installation described in U.S. Pat. No. 5,113,785, the coating station and the vapour-removal and drying station are arranged side by side in the longitudinal direction of the installation. Arranged upstream and downstream of the coating station and the vapour-removal and drying station are transverse conveyors which transfer the printed circuit boards from the transport line with the coating station to the adjacent transport line with the vapour-removal and drying station. The coating installation described in U.S. Pat. No. 5,113,701 is constructed in a single line. In that installation, the vapour-removal and drying station is arranged substantially above the coating station. The printed circuit boards which have been coated on one or both sides are subjected to vapour-removal and dried while they are being transported in specially constructed holding devices above the coating station back to the entrance to the coating station or to the exit of the coating installation. Apart from the requirement for special holding means for the printed circuit boards, that coating installation has a large overall height because the vapour-removal and drying station is arranged substantially above the coating station.

While the described coating installations of the prior art meet the requirements of modern printed circuit board coating technology, they are nevertheless in need of improvement in one respect or another. It is a common feature of all three coating installations described that they require relatively great expenditure with respect to the infrastructure at the installation site. The work of installation is considerable because the preheating station and the vapour-removal and drying station(s) must each be connected into the air supply and removal system on site. It is especially to be borne in mind that the exhaust air of the vapour-removal and drying station(s) generally contains flammable solvent vapours and the installations must therefore meet safety standards. The solvent-containing exhaust air must be fed to the removal devices present on site where the solvent vapours are burnt together with other exhaust air or are removed from the exhaust air by some other method.

Pumps must be provided in order to suck in the inlet air and in order to circulate the air in each vapour-removal and drying station and, if present, in the preheating station. The air supplied to the preheating station and, especially, to the vapour-removal and drying station(s) has to be heated. For that purpose, heating devices are to be provided for the individual stations, which devices heat the inlet air to the desired temperature. The arrangement of the suction and circulating pumps and the heating device inside the preheating station and especially inside each vapour-removal drier considerably increases the space requirement of those devices and, in particular, their overall height is often too great and gives rise to problems during the transport and mounting of those devices.

The known coating installations for printed circuit boards have to be installed at sites that meet certain minimum standards in respect of clean-room quality, the intention being to prevent dirt or dust particles from reaching the surfaces of the printed circuit boards to be coated and impairing the quality of the coating. Dirt or dust particles that have settled on the surface can act as scattering centres during the subsequent photographic exposure of the coating, so that the coating is exposed, and then developed, at undesired sites. In the worst case, the contaminants on the surfaces can even result in short-circuits between the conductors. The printed circuit board affected is unusable in each case. In order to achieve the required clean-room quality, great expenditure is required with respect to the purifying and filtering of the air volume in the rooms in which the coating installation is installed. Bearing in mind the space requirement of coating installations, especially those for coating printed circuit boards on both sides, and the necessary size of the rooms in which the coating installations accordingly have to be set up, it is easy to understand why the provision and maintenance of the necessary clean-room quality take up a not inconsiderable proportion of the operating costs of the coating installation.

OBJECTS AND SUMMARY OF THE INVENTION

The problem of the present invention is accordingly to improve the aspects of the coating installations of the prior art that are in need of improvement. In particular, the invention is to provide an apparatus for coating board-shaped articles, especially printed circuit boards, in the case of which the necessary expenditure on installation is markedly reduced. It is to be possible to operate the coating installation substantially independently of the infrastructure present at the installation site and only the most essential connections are to be necessary. The coating installation is to have a compact structure and have a small space requirement. The overall height is to be small so that the installation can be transported without difficulty and so that its installation at the set-up site requires no specially constructed rooms. A further problem of the present invention is to provide a coating installation that permits a reduction in the clean-room volume to be provided.

All those and other associated problems are solved by a coating installation for board-shaped articles, especially printed circuit boards, which comprises at least one coating station having a pouring table for coating one surface of the printed circuit boards with preferably UV-hardenable plastics, lacquer or the like, and, adjoining that station, a vapour-removal and drying station having a vapour-removal drier for the removal of vapour from and drying of the coated surfaces of the printed circuit boards in the stream of hot air. The vapour-removal and drying station has an air processing module which is arranged in a housing which adjoins the entrance side of the housing of the vapour-removal drier and extends over the free space above the pouring table. The coating installation according to the invention is substantially independent of the infrastructure at the installation site. The entire air processing system is integrated in the coating installation. Space that is already available and would otherwise be unused is exploited. The necessary clean-room volume is reduced and cost-intensive systems for the provision of the necessary clean-room quality can be largely dispensed with. The coating installation remains compact despite the integration of the entire air processing system; as a result of the omission of installations and pipelines for air conveyance, the space requirement is even reduced. The time required for installation and the installation costs are reduced.

Further and preferred embodiments of the invention are subject of the dependent claims. The therein claimed variants solve still further objects of the invention.

BRIEF DESCRIPTION OF THE DRAWINGS

The invention is explained hereinafter in several preferred embodiments with reference to the drawings, some of which are schematic and in which:

FIG. 1 shows a first coating installation according to the invention,

FIG. 2 shows a second embodiment of the coating installation,

DETAILED DESCRIPTION OF THE EMBODIMENTS SHOWN IN THE DRAWINGS

Figure 3:
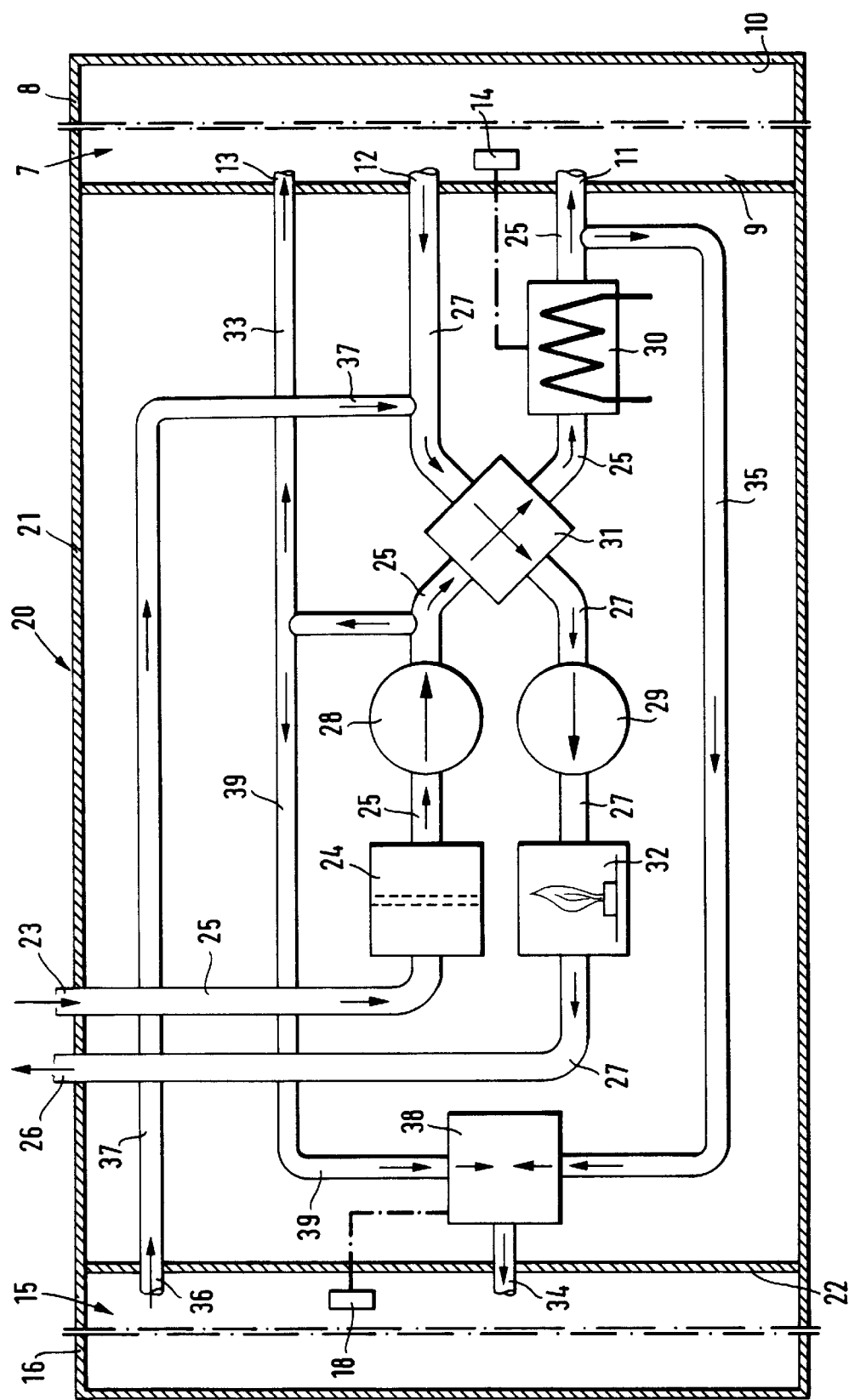
FIG. 3 is a block diagram of an embodiment of an air processing module.

The coating installation shown schematically in FIGS. 1 and 2 has the general reference numeral 1. It comprises, in the sequence of their arrangement, a coating station 2 and a vapour-removal and drying station 6 through which the printed circuit boards pass in succession in the direction of passage D. Arranged at the exit of the vapour-removal and drying station 6 is a delivery roller conveyor 40 by means of which the printed circuit boards can be conveyed to other processing installations. The coating station 2 comprises a pouring table 3 having a pouring head. The pouring head is so constructed that preferably UV-hardenable plastics, lacquer or the like which is pumped to the pouring head forms a free-falling pouring curtain under which the surfaces of the printed circuit boards to be coated are transported. The lateral extent of the pouring curtain, transverse to the direction of transport D of the printed circuit boards, is delimited by pouring blades. Such a pouring head is described, for example, in U.S. Pat. No. 4,559,896, the content of which is hereby declared to be an integral part of the present description. The pouring blades ensure that a narrow border along the longitudinal sides of the printed circuit boards remains free of the coating.

In the coating station 2, the printed circuit boards are preferably guided laterally at their longitudinal edges. The guide means are formed preferably by two laterally arranged conveyor belts, each of which runs round an associated guide bar in the direction of transport D of the printed circuit boards. The guide bars can be adjusted to the width of the printed circuit boards automatically, preferably electro-pneumatically. In that manner the printed circuit boards are aligned so that their longitudinal edges extend approximately parallel to the direction of transport D. The conveyor belts grip the longitudinal edges of the printed circuit boards and transport them under the free-falling pouring curtain for the purpose of coating. The pouring blades delimiting the pouring curtain laterally ensure that the conveyor belts do not become soiled. Such a coating station is described, with all its details, for example, in EP-A-0,542,684, the content of which is hereby declared to be an integral part of the present description.

Following the exit 5 of the coating station, in the direction of transport D, is a vapour-removal and drying station 6 which comprises a vapour-removal drier 7 which is preferably constructed as a hot-air circulating drier. The printed circuit boards coming from the coating station are introduced into special holding elements which are secured inside the housing of the vapour-removal drier to one or more endless circulating chains, cables or the like. The vapour-removal drier has a substantially vertically orientated structure. The approximately horizontally projecting holding elements are transported vertically upwards, flipped over at the top turn-round site so that the boards in the holding devices are turned, and transported vertically downwards again, projecting approximately horizontally from the chains or cables. After transfer of the dried printed circuit boards to the delivery roller conveyor 40, the holding devices are turned round at the lower turnround site of the chains or cables and transported vertically upwards again. Such a continuous-flow drier is described, for example, in EP-A-0,541,879, the content of which is hereby declared to be an integral part of the present description. In the vapour-removal drier, the coated printed circuit boards are exposed to a stream of hot air and, during that operation, solvent contained in the coating is evaporated (removed by a current of air) and the coating is more or less dried.

According to the invention, the vapour-removal and drying station 6 comprises an air processing module which has the general reference number 20 in each of FIGS. 1 to 5. The air processing module 20 is arranged in a housing 21 which adjoins the entrance side 9 of the housing 8 of the vapour-removal drier 7, above the plane of transport T of the printed circuit boards, and extends above the pouring table 3 of the coating station 2. In that manner, the free space above the coating station 2 is used to accommodate the units required for air processing. The housing 21 of the air processing module 20 is preferably fixedly connected to the housing 8 of the vapour-removal drier 7 so that no other support members are required for the free end of the housing 21. The dimensions of the housing 21 of the air processing module 20 are so selected that it does not project beyond the height and beyond the width of the vapour-removal drier 7, and that its length Y corresponds to the length X of the coating station 2. Thus, the dimensions and the space requirement of the coating installation are determined solely by the dimensions of the coating station 2 and of the vapour-removal and drying station 6 together with the delivery roller conveyor 40. The air processing module is arranged in the free space above the pouring table 3, which otherwise remains unused.

FIGS. 1 to 3 show schematically three embodiments of the air processing module 20. According to the embodiment in FIG. 1, the air processing module 20 has an air-inlet opening 23 and an exhaust-air connection 26 which, as shown, are provided, for example, in the top longitudinal wall of the housing 21. The air-inlet opening 23 is connected to an air-inlet line 25 arranged inside the housing 21, which line for its part opens into an air-inlet duct 11 arranged at the entrance side 9 of the vapour-removal drier 7. An air filter 24 is preferably arranged directly at the air-inlet opening 23 and filters impurities out of the inlet air. A first circulating device 28 arranged in the air-inlet line 25 transports the inlet air from the air-inlet opening 23 to the vapour-removal drier. The exhaust-air connection 26 is connected to an exhaust-air line 27 which opens into an exhaust-air duct 12 which is arranged inside the vapour-removal drier 7. The exhaust air arising in the vapour-removal drier 7, which air generally contains solvent, is transported by means of a second circulating device 29, which is arranged in the exhaust-air line 27 inside the housing 21 of the air processing module 20, from the vapour-removal drier 7 to the exhaust-air connection 26. Preferably, the first and second circulating devices 28, 29 are fans, the output of which can be regulated.

In order to heat the inlet air to the desired temperature, the air processing module 20 comprises a heating device 30 which is arranged in the inlet-air stream between the first circulating device 28 and the site where the air-inlet line 25 opens into the air-inlet duct 11. The heating device 30 is preferably an electrical resistance heater which is connected to a thermostat device 14 which is arranged inside the vapour-removal drier 7, at the entrance side 9 thereof (FIG. 3). With the aid of the thermostat device 14, the heat output of the electrical resistance heater 30 can be regulated, preferably automatically, in accordance with the desired temperature in the vapour-removal drier 7. In order to exploit the heat contained in the heated exhaust air coming from the vapour-removal drier 7, the exhaust air is transported to a heat exchanger 31. The heat exchanger 31 is arranged between the first circulating device 28 and the heating device 30 and is used to pre-heat the inlet air. The heat exchanger 31 has connections for the air-inlet line 25 and for the exhaust-air line 27. This ensures that the inlet air and the exhaust air are separated, that is to say, that they cannot mix.

A coating installation 1 having an air processing module 20 constructed in that manner requires only a small amount of expenditure on installation at the installation site. The inlet air can be taken from the surroundings. If the inlet air is to be taken from a supply line, a connection is simply made to that supply line. A connecting line to a central exhaust-air removal installation is connected to the exhaust-air connection 26 provided at the housing 21 of the air processing module 20, and the exhaust air, which generally contains solvent, is transported via that line to a combustion installation or to a similar elimination installation.

The embodiment of the air processing module 20 shown in FIG. 2 corresponds substantially to the embodiment according to FIG. 1. In addition, it has, between the first circulating device 28 and the heat exchanger 31, a branch line 33 via which cold inlet air is transported to a cold-air duct 13 arranged inside the vapour-removal drier 7, at the exit side 10 thereof. Thus, the heated printed circuit boards can be cooled again during downward transport and before passing out of the vapour-removal drier 7. After sweeping over the surface of the printed circuit boards, the cold air is suctioned off via a second exhaust-air duct 12A which is connected to the exhaust-air duct 12. Apart from having means for supplying the vapour-removal drier with cold inlet air, the air processing module according to FIG. 2 is also equipped with an exhaust-air purifying device 32. The exhaust-air purifying device 32 is arranged in the exhaust-air line 27, between the second circulating device 29 and the exhaust-air connection 26. It is preferably constructed as a catalytic exhaust-air combustion installation, as familiar to the person skilled in the art and described, for example, in brochure no. 102-2(0285) of LTG Luft-technische GmbH, Wernerstrasse 119–129, 7000 Stuttgart 40 (Zuffenhausen).

A coating installation 1, which, as shown in FIG. 2, has an air processing module 20 which is equipped with an exhaust-air purifying device 32, is practically independent of the exhaust-air removal system on site. Exhaust air which has been cleansed of the final traces of solvent, and which is harmless and can even be discharged into the surroundings, is expelled through the exhaust-air connection 26. Thus, there is no expenditure whatever on installing air-inlet lines and exhaust-air lines.

FIG. 3 shows a block diagram of an air processing module 20 which has been prepared for the connection of a preheating station 15 for the printed circuit boards which is arranged in front of the entrance 4 to the coating station 2. For that purpose, the air processing module 20 is equipped with an inlet-air and exhaust-air service connection 34 and 36, which connections are arranged at the end 22 of the housing 21 of the air processing module 20 that is remote from the vapour-removal drier 7. The inlet-air service connection 34 opens into an inlet-air supply line 35 which branches off from the air-inlet line 25 downstream of the heating device 30 for the inlet air. The exhaust-air service connection 36 is connected to an exhaust-air supply line 37 which opens into the exhaust-air line 27 upstream of the heat exchanger 31. There is preferably arranged in the inlet-air supply line 35 an air mixer 38 into which opens a cold-air line 39 which branches off from the air-inlet line 25 between the first circulating device 28 and the heat exchanger 31. The air mixer 38 can preferably be operated and regulated automatically and is connected to a thermostat device 18 which is arranged inside the housing 16 of the preheating station 15 and by means of which the ratio of heated and cold inlet air in the air mixer 38 can be regulated in accordance with the desired temperature in the preheating station 15. If necessary, it is possible to arrange in the inlet-air supply line 25 a further circulating device which is preferably a fan the output of which can be regulated as desired.

In the case of a coating station 1 that comprises an air processing module 20 according to the embodiment shown in FIG. 3, it is also possible to connect a preheating station 15 without being dependent on the infrastructure at the installation site. The air processing module 20 takes the inlet air preferably from the surroundings and provides the required amount of the necessary cold inlet air or inlet air heated to the desired temperature for the vapour-removal drier 7 and for the preheating station 15. The exhaust air coming from the vapour-removal drier 7 and from the preheating station 15 is conveyed through the heat exchanger 31 where it gives up most of the heat it contains to the inlet air which is still cold, and preheats that air. The exhaust air is then conveyed to the exhaust-air purifying device 32 where the solvent contained in the exhaust air is, for example, catalytically burnt or is removed by some other method. The purified exhaust air can be discharged into the surroundings via the exhaust-air connection 26.

Figure 4:
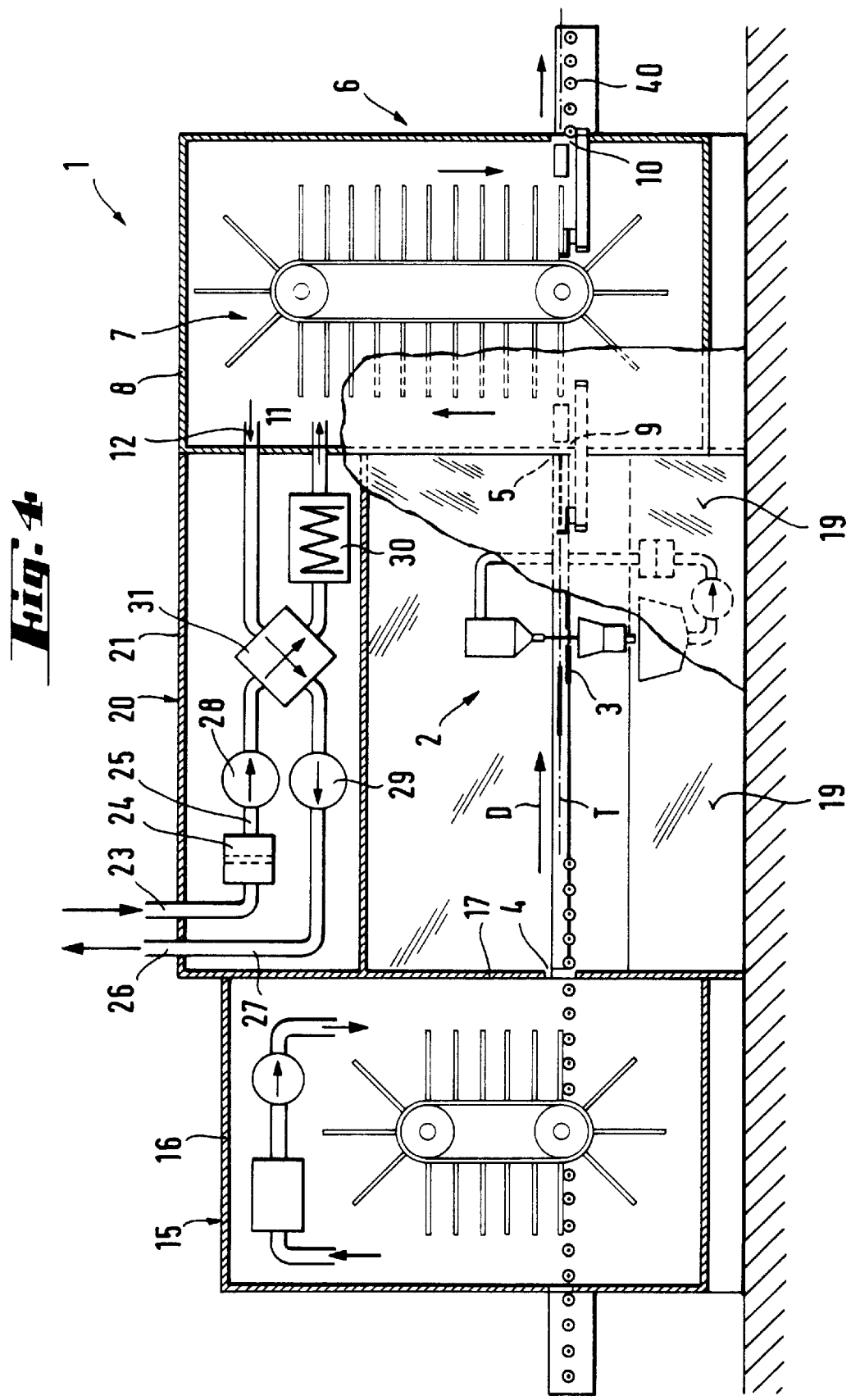
FIGS. 4 and 5 show two other embodiments of the coating installation.
Figure 5:
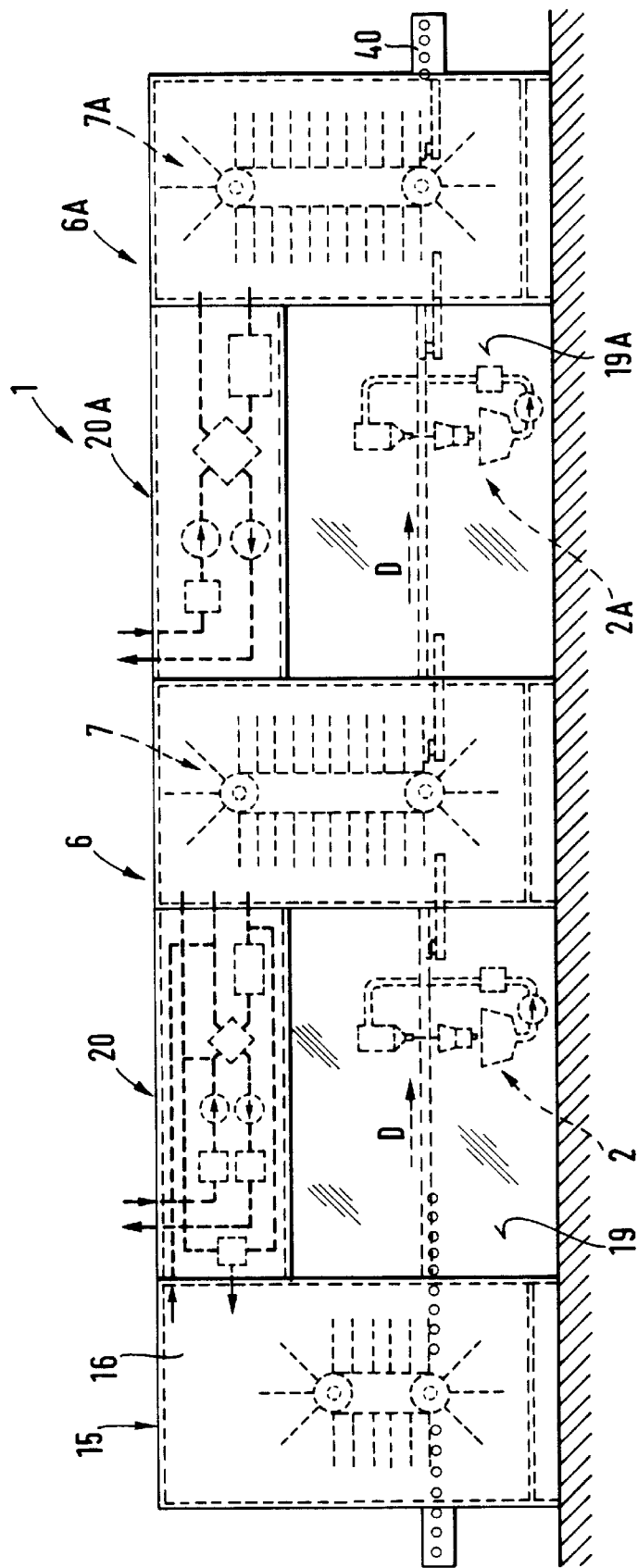

In the case of the embodiments of the coating installation 1 according to the invention shown in FIGS. 4 and 5, the problem of reducing the necessary clean-room volume for the installation is also solved. For that purpose the coating station 2 of the coating installation 1 shown in FIG. 4 is, according to the invention, substantially sealed off from the surrounding air by structural measures. The sealing of the coating station 2 is effected by two walls 19, preferably Plexiglas walls, which run from the lower edge of the housing 21 of the air processing module 20 as far as the floor and extend on both longitudinal sides of the coating station 2 from the housing wall on the entrance side 9 of the vapour-removal drier 7 along the entire length of the coating station 2. At the entrance 4 of the coating station 2, the two walls adjoin an end sealing wall 17. In the case of a coating installation 1 that comprises a preheating station 15 for the printed circuit boards upstream of the coating station 2, the end sealing wall 17 is, as shown, formed by the housing wall of the preheating station 15 on its exit side. In the case of a coating installation 1 without a preheating station 15, a separate sealing wall is provided which, at the entrance 4 of the coating station 2, extends from the lower edge of the housing 21 of the air processing module 20 as far as the floor and has only an insertion slot for the printed circuit boards to be coated, at the level of the plane of transport T of the printed circuit boards. Following on from the first sealed coating station 2 and the first vapour-removal and drying station 6 with air processing module 20, the coating installation 1 shown in FIG. 5 has a second coating station 2A which is likewise substantially sealed off from the surrounding air. Following on from the second coating station 2A is a second vapour-removal and drying station 6A which, analogously to the first station, has a vapour-removal drier 7A and, connected thereto, an air processing module 20A. Such a coating installation 1 is designed especially for coating board-shaped articles, especially printed circuit boards, on both sides.

The coating installations 1 according to the embodiments in FIGS. 4 and 5 not only are substantially independent of the infrastructure at the installation site in respect of inlet-air supply and exhaust-air removal but also have a markedly reduced clean-room volume. As a result of the fact that the coating station 2 is practically sealed off from the surrounding air, and the clean-room volume is limited to the space within the sealing walls 19, 17, it is even possible to dispense with the provision of clean-room quality in the room or the building in which the coating station is installed. The air inside the sealing walls 19, 17 before the initial start-up of the coating installation 1 is exchanged during the operation of the installation for air provided by the air processing module 20. A separate inlet-air feed system may be provided at the underside of the housing 21 of the air processing module 20 for that purpose. Generally, however, the air that passes from the exit of the preheating station 15 or from the entrance to the vapour-removal and drying station 6 into the coating station 2 is sufficient.

Such a coating installation requires no installations for the inlet air or the exhaust air, and expensive measures to provide a clean room can be dispensed with. It is necessary only to supply the individual units of the coating installation with energy. That requires only the connection of a single main service connection to the power supply network on site. The individual units are supplied with energy by a distribution station (not shown) integrated in the coating installation.

The coating installation according to the invention is substantially independent of the infrastructure at the installation site. The entire air processing system is integrated in the coating installation. Space that is already available and would otherwise be unused is exploited. The necessary clean-room volume is reduced and cost-intensive systems for the provision of the necessary clean-room quality can be largely dispensed with. The coating installation remains compact despite the integration of the entire air processing system; as a result of the omission of installations and pipelines for air conveyance, the space requirement is even reduced. The time required for installation and the installation costs are reduced.

What is claimed is:

1. An apparatus for coating printed circuit boards, comprising:

a coating station (2) having a coating means including a pouring table (3), said means adapted to coat one surface of each of a plurality of printed circuit boards received therein with a protective layer, and, adjoining said station, means for conveying each of said plurality of printed circuit boards from said coating station (2) to said vapour-removal and drying station (6), a vapour-removal and drying station (6) having a vapour-removal drier (7) for the removal of vapour from, and drying of, the coated surfaces of the plurality of printed circuit boards by a stream of heated air, wherein the vapour-removal drier (7) includes a housing (8), wherein the vapour-removal and drying station (6) is connected to an air processing module (20) which is arranged in a housing (21) which adjoins an entrance side (9) of the housing (8) of the vapour-removal drier (7) and extends over and above the pouring table (3);

said air processing module (20) comprising:

a housing (21) with an air inlet opening (23) to admit air and an exhaust air outlet (26), an air inlet line (25) connected to said air inlet opening (23), an exhaust air line (27) connected to said exhaust air outlet (26), a first circulating means (28) in said air inlet line (25) for circulating air admitted through said opening (23), second circulating means (29) in said exhaust air line (27) for exhausting air through said exhaust air outlet (26), said air inlet line (25) and said exhaust air line (27) being respectively connected to an air-inlet duct (11) and an exhaust air duct (12) of said vapor removal drier (7), said inlet duct (11) and an exhaust air duct (12) opening into the entrance side (9) of the housing of said vapour-removal drier (7), said vapour-removal drier (7) being a circulating drier, a heating device (30) for heating the inlet air inside the housing (21) and providing said stream of heated air to said vapour-removal drier (7), said heating device (30) being arranged in said air inlet line (25) and between said first circulating means (28) and the air inlet duct (11), said heating device (30) being responsive to a thermostat device (14) which is arranged inside the vapour-removal drier (7) on said entrance side thereof and by which the heating of the inlet air is regulated in accordance with the desired temperature in the vapour-removal drier (7); and an exhaust-air purifying device (32) arranged in said exhaust-air line (27) and between said second circulating device (29) and said exhaust-air outlet (26).

2. An apparatus according to claim 1, wherein the housing (21) of the air processing module (20) is fixedly connected to the housing (8) of the vapour-removal drier (7), the dimensions of the housing (21) of the air processing module (20) are so selected that it does not project beyond the height and the width of the vapour-removal drier (7), and its length (Y) corresponds to the length (X) of the coating station (2).

3. An apparatus according to claim 1, wherein the first and second circulating devices (28, 29) are fans, the output of which can be regulated, and the heating device (30) for the inlet air is an electrical resistance heater that can be regulated automatically.

4. An apparatus according to claim 3, wherein there is arranged between the first circulating means (28) and the electrical resistance heater (30) a heat exchanger (31) which is connected on the one hand to the air-inlet line (25) and on the other hand to the exhaust-air line (27) and is constructed to preheat the inlet air.

5. An apparatus according to claim 4, wherein there is provided between the first circulating means (28) and the heat exchanger (31) a branch line (33) which is connected to a cold-air duct (13) of the vapour-removal drier (7), which duct (13) opens into the interior of the vapour-removal drier (7) at its exit side (10) and is used to cool the dried printed circuit boards.

6. An apparatus according to claim 5, wherein the air-inlet opening (23) is equipped with an inlet air filter (24).

7. An apparatus according to claim 4, wherein the air processing module (20) has an inlet-air connection (34) and an exhaust-air connection 36 for a predrying station (15), which connections (34, 36) are arranged at the end (22) of the housing (21) of the air processing module (20) that is remote from the vapour-removal drier (7), said inlet-air connection (34) opening out from an inlet-air supply line (35) which branches off from the air-inlet line (25) downstream of the heating device (30) and conveys heated air, and the exhaust-air connection (36) being connected to en exhaust-air removal line (37) which opens into the exhaust-air line (27) upstream of the heat exchanger (31).

8. An apparatus according to claim 7, wherein there is arranged in the inlet-air supply line (34) for the predrying station (15) an air mixer (38) which can be controlled automatically and into which opens a cold-air line (39) which branches off from the air-inlet line (25) between the first circulating means (28) and the heat exchanger (31), which air mixer (38) is connected to a thermostat device (18) which is arranged inside the pre-heating station (15) and by means of which the ratio of heated inlet air and cold inlet air in the air mixer (38) can be regulated in accordance with the desired temperature in the pre-heating station (15).

9. An apparatus according to claim 8, wherein the coating station (2) includes sealing means for sealing off the surrounding air by structural measures.

10. An apparatus according to claim 9, wherein the sealing of the coating station (2) is effected by two fiberglass walls (19) which run, on both longitudinal sides of the coating station (2), from the lower edge of the housing (21) for the air processing module (20) as far as the floor and extend from the wall on the entrance side of the housing of the vapour-removal drier (7) along the entire length (X) of the coating station (2) and adjoin an end sealing wall (17) arranged on the entrance side (4) of the coating station (2).

11. An apparatus according to claim 10, wherein the end sealing wall (17) is formed by the wall at the exit side of the housing (16) of a preheating station (15).

12. An apparatus according to claim 1, wherein there is arranged following the first vapour-removal and drying station (6) a second coating station (2A) for coating the second surface of the printed circuit boards and, following said second coating station, a second vapour-removal and drying station (6A) which comprises at least one vapour-removal drier (7A) having an integrated air processing module (20A).

13. An apparatus according to claim 12, wherein the coating stations includes sealing means for sealing off the surrounding air.

14. An apparatus according to claim 1, wherein said protective layer is selected from the group consisting of a UV-hardenable plastic and a lacquer.

* * * * *